(12) United States Patent
Miller et al.

(10) Patent No.: US 8,406,284 B2
(45) Date of Patent: Mar. 26, 2013

(54) RECEIVER WITH ADAPTIVE EQUALIZER

(75) Inventors: David C. Miller, Whitehall, PA (US);
Marc J. Ryba, Lansdale, PA (US)

(73) Assignee: General Instrument Corporation, Horsham, PA (US)

( * ) Notice: Subject to any disclaimer, the term of this patent is extended or adjusted under 35 U.S.C. 154(b) by 949 days.

(21) Appl. No.: 11/842,660

(22) Filed: Aug. 21, 2007

(65) Prior Publication Data

US 2009/0051458 A1    Feb. 26, 2009

(51) Int. Cl.
*H04B 1/10* (2006.01)
(52) U.S. Cl. .......................................... 375/232; 375/350
(58) Field of Classification Search .................. 375/320, 375/346, 350; 329/347, 349, 350, 353; 455/210
See application file for complete search history.

(56) References Cited

U.S. PATENT DOCUMENTS

| | | | |
|---|---|---|---|
| 4,384,354 A | 5/1983 | Crawford et al. | |
| 4,688,255 A * | 8/1987 | Kahn ............................... | 381/16 |
| 5,187,719 A | 2/1993 | Birgenheier et al. | |
| 5,724,388 A | 3/1998 | Nagano et al. | |
| 6,385,237 B1 * | 5/2002 | Tsui et al. ...................... | 375/228 |
| 7,089,478 B2 * | 8/2006 | Cummings et al. ........... | 714/755 |
| 7,142,609 B2 * | 11/2006 | Terreault et al. ............... | 375/261 |
| 7,796,713 B2 * | 9/2010 | Lee ................. | 375/345 |
| 2002/0154620 A1 * | 10/2002 | Azenkot et al. ............... | 370/347 |
| 2003/0189993 A1 * | 10/2003 | Coene et al. .................. | 375/341 |
| 2003/0189994 A1 * | 10/2003 | Sommer et al. ............... | 375/341 |
| 2003/0219085 A1 * | 11/2003 | Endres et al. .................. | 375/350 |
| 2008/0123788 A1 * | 5/2008 | Wongwirawat et al. ...... | 375/348 |

OTHER PUBLICATIONS

Patent Cooperation Treaty, "International Search Report and Written Opinion of the International Searching Authority," for Int'l Application No. PCT/US2008/073252; Nov. 12, 2008.
Office Action issued in corresponding Mexican Patent Application No. MX/0/2010/002013, dated Jul. 21, 2011.

\* cited by examiner

*Primary Examiner* — Don N Vo
(74) *Attorney, Agent, or Firm* — Susan R. Payne

(57) ABSTRACT

Receivers and methods for receiving a signal may result in improved performance by resolving specific impairments at particular levels. For example, bit error ratio (BER) in the downstream signal of an HFC network may be improved by resolving up to 6% AM hum. Thus, the receivers and methods described herein may function with dramatically improved error rates and continuous FEC lock, in relation to conventional receivers, in the presence of SCTE 40 impairments and full channel loading over the receivers entire input dynamic range.

16 Claims, 3 Drawing Sheets

RECEIVER WITH ADAPTIVE EQUALIZER

FIELD OF INVENTION

Disclosed herein are various embodiments relating to electronic signal receivers and more specifically to receivers for resolving impairments in electronic signals.

BACKGROUND

The majority of modern cable telecommunications systems used today are built with a Hybrid Fiber Coax (HFC) network topology. This topology uses fiber optic cable to transmit optical signals to and from a fiber optic node located near a cable subscriber, such as a residential home subscribing to cable telecommunication services. The fiber optic node receives and converts the optical signals into Radio Frequency (RF) signals. These RF signals are then transmitted from the fiber optic node to the subscriber's home over a coaxial cable.

FIG. 1 illustrates a conventional HFC network 100. The HFC network 100 includes a head-end 102. The head-end 102 is a facility for receiving, processing, and distributing media signals, including video, audio, and data signals, over the HFC network 100. The head-end 102 is typically maintained or managed by a media service provider or a multiple service operator (MSO), such as a cable television (CATV) provider or an Internet service provider (ISP). The head-end 102 may include any reasonably suitable electrical equipment for receiving, storing, and re-transmitting media signals, such as media servers, satellite receivers, modulators/demodulators, edge decoders, etc.

The head-end 102 typically includes a transmitter to transmit the media signals downstream to the subscribers 110, over a fiber optic link 104 to one or more fiber optic nodes 106, each supporting any number of subscribers 110, depicted here as residential homes. Each fiber optic node 106 receives and converts the optical signals sent from the head-end 102 into RF signals, which are then delivered to the subscribers 110, via coaxial cables 108. The subscribers 110 have a receiver, such as a cable modem and/or a multimedia terminal adapter (MTA), for receiving the signals sent from the transmitter.

Since information transmitted from the head-end 102 is often expressed in a digital form, for example as a stream of finite values of data, head-end transmitters often send digitally modulated signals. Various modulation techniques have been developed to efficiently transmit information expressed in a digital form. These include amplitude modulation and phase modulation. For example, quadrature phase shift keying (QPSK), DQPSK, and M-level quadrature amplitude modulation (QAM) are a few such techniques. These techniques define a constellation of symbols, where each symbol may be used to communicate a plurality of bits of data. The symbols are identified based on their position on a plot of phase and amplitude called an I/Q plane.

When modulated signals are transmitted downstream from the transmitter at the head-end 102 to a receiver, generally, the initial signal created at the head-end 102 is pure. That is, the modulated signal originating from the head-end 102 lacks degradations and/or impairments. Impairments are errors gathered by a signal as the signal is transmitted. Impairments inhibit the ability of a receiver to interpret the signal sent from the transmitter and may sometimes lead to failure of the receiver and loss of data.

Impairments can be attributed to a variety of sources, and they can distort signal transmission on the HFC network 100. For instance, many devices, including common household appliances such as garbage disposals and blenders, emit signals at various frequencies, which enter the HFC network 100 through poorly shielded cables or through the communication devices attached to the cable network within the home.

Moreover, additional traffic on networks, such as signals from other receivers and television signals, can interfere with signal transmission to create impairments. The accumulation of interfering signals reduces the carrier-to-noise ratio (CNR), which, in turn, reduces throughput as forward error correction (FEC) techniques are more heavily utilized to deal with signal errors caused by impairments.

One particular impairment is known as hum modulation, also known as amplitude modulation (AM) hum, which is the amplitude distortion of a signal caused by the modulation of the signal by components of the frequency on the transmission line that carries the signal. In other words, AM hum in a system signal is the peak-to-peak variation in the signal level caused by undesired low frequency disturbances (hum or repetitive transients) generated within the system, or by inadequate low frequency response. AM hum may be expressed as a ratio, in decibels (dB), of the peak-to-peak variation of the transmitting signal to the peak of such a signal. Alternatively, AM hum may be expressed as a percentage of the peak-to-peak variation of the signal level to peak voltage amplitude of the signal.

Impairments, such as AM hum have plagued HFC networks since their inception, but regardless of how well a network is designed, impairments remain and can negatively affect system performance. A key to efficient transmission of data over a network is accounting for these impairments in the design of the receiver. For example, cable modems are designed with filters, which resolve some impairments in signals received from the head-end 102. However, while filters currently improve signal transmission, impairments, such as AM hum, continue to inhibit the transmission of data over communications networks, such as the HFC network 100.

BRIEF DESCRIPTION OF THE DRAWINGS

Various features of the embodiments described in the following detailed description can be more fully appreciated when considered with reference to the accompanying figures, wherein the same numbers refer to the same elements.

DETAILED DESCRIPTION

Figure 1:
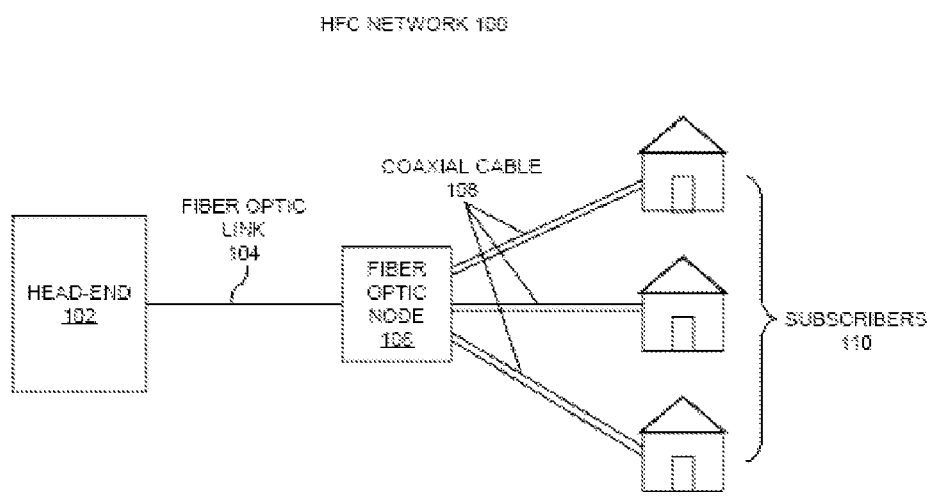
FIG. 1 illustrates a prior art HFC network.

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures have not been described in detail so as not to unnecessarily obscure the embodiments.

According to an embodiment, a receiver is provided to receive transmitted signals and resolve impairments in the transmitted signals to improve the stability and reliability of a communications network. The receiver may be any reasonably suitable device for receiving an electronic signal. For instance, the receiver may include a modem, such as a cable modem, set top box or media terminal adapter, and the signal may be a digitally modulated signal transmitted to the receiver from a transmitter. However, a person having ordinary skill in the art will appreciate that the receiver may be any device for receiving an electronic signal transmitted over any reasonably suitable transmission path or network.

The receiver includes an adaptive equalizer for resolving impairments in the transmitted signal. Adaptive equalization refers to the process of dynamically adjusting to compensate for changing transmission path characteristics. For instance, as load demand in a network changes, the impairments on the signals transmitted in that network will also change. Therefore, the adaptive equalizer may adapt to meet these changing conditions to resolve different levels of impairment and different types of impairments. The adaptive equalizer may be tuned to resolve any reasonably suitable number of different impairments, including AM hum. That is, the adaptive equalizer may be programmed with software and/or firmware, for instance, to resolve the different impairments. Specifically, the adaptive equalizer may resolve AM hum at a level above 3%. For instance, the adaptive equalizer may resolve up to 6% AM hum.

In a preferred implementation, the receiver may remove distortions in the amplitude component of a transmission signal having a information modulated on a carrier signal, such as a transmission signal transmitted in an hybrid fiber coaxial (HFC) network or entirely optical fiber network. The distortions in the amplitude component may generally be referred to as "AM hum" or "AM distortions." Those of skill in the art will appreciate that a transmitted data signal is typically carried by modulation of a carrier signal, the carrier signal having a predetermined frequency. Typical modulation schemes include amplitude modulation and frequency modulation. In either modulation scheme, the modulated data signal typically has a phase component and an amplitude (AM) component in an orthogonal relationship to each other which together provide information composing the data when properly demodulated and decoded by a receiver. Applicants have discovered that the amplitude component of the modulated data signal is often distorted over an extended bandwidth of the data signal transmission frequency, such as 10 Hz-20 KHz.

The systems and methods described herein may result in improved receiver performance by reducing distortions in the amplitude component of the data signal. For example, bit error ratio (BER) performance may be improved by resolving up to 6% AM hum or more. Thus, the systems and methods described herein may function with dramatically improved error rates and continuous FEC lock, in relation to conventional receivers, in the presence of SCTE 40 impairments and full channel loading over the receivers entire input dynamic range.

Figure 2:
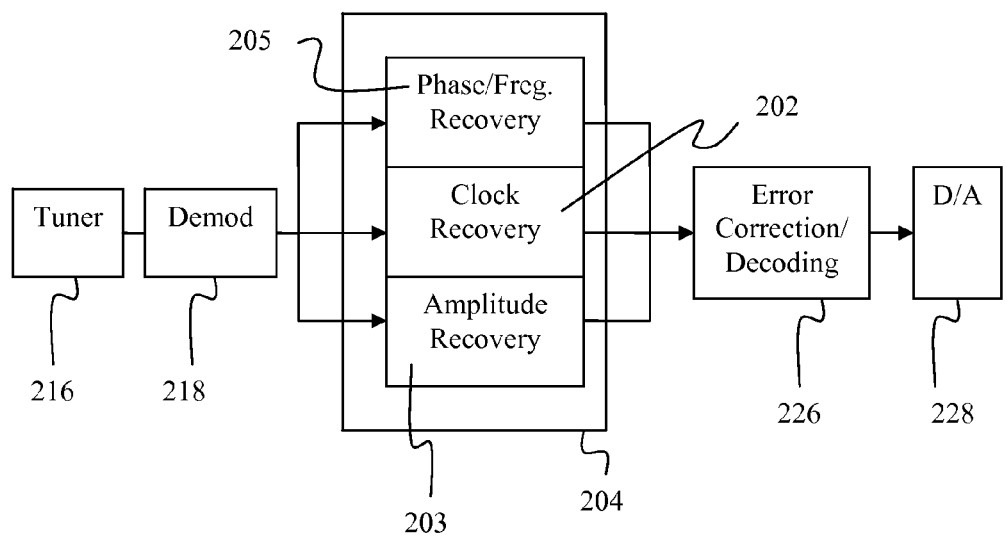
FIG. 2 illustrates a receiver according to the invention.

FIG. 2 illustrates a receiver in accordance with the present invention. Those of skill in art will appreciate that the receiver receives a signal transmitted by a transmitter which is typically located in a remote location, such as a headend of an HFC network. In addition, it should be understood that the receiver may include additional components and that some of the components described herein may be removed and/or modified without departing from a scope of the invention.

The communication system (or network) may provide any reasonably suitable method of transmitting an electronic signal between different devices. For example, the communications system may be a part of the HFC network 100, depicted in FIG. 1. In this regard, the transmitter may be an electronic device located at the head-end 102. Therefore, the propagation medium may be the fiber optic link 104, the fiber optic node 106, and/or the coaxial cable 108. Similarly, the receiver may be a device, such as a cable modem, set top box and/or media terminal adapter located downstream of the head-end 102 at the subscribers 110.

A transmitter (not shown) typically includes an information source coupled to a digital encoding subsystem. The information source may be any source of data, such as textual, audio, and/or video data, and the digital encoding subsystem may be hardware, software, or combination of hardware and software for digitally encoding data, as is known in the art. For example, the digital encoding subsystem may include a quadrature amplitude modulation (QAM) encoder, which creates an in-phase component (I) and a quadrature phase component (Q) of a data signal. The digital encoding subsystem is typically coupled to a modulator for modulating the signal received therefrom and transmitting the modulated signal. For example, the modulator may include a QAM modulator, which modulates the I and Q signal components onto a suitable carrier frequency, provided by a carrier oscillator, for transmission over a propagation medium. The propagation medium may include any reasonably suitable system, or combination of subsystems, for transmitting data, including wired or wireless transmission networks.

As illustrated in FIG. 2, the receiver includes a tuner 216, a demodulator 218, an adaptive equalizer 204, an error correction and decoding unit 226, and a digital to analog converter 228. The equalizer 204 contains a phase and frequency recovery unit 205 which recovers the phase and frequency of the transmitted data signal. The equalizer 204 also contains a clock recovery unit 202 which recovers the clock of the transmitted data signal. An amplitude recovery unit 203 is also contained in the equalizer 204 which recovers the amplitude component (AM) of the data signal. Those of skill in the art will appreciate that the phase/frequency recovery unit 205, clock recover unit 202 and amplitude recovery unit 203 are merely functionally illustrated separately for discussion purposes, and that each of these units may be performed by a single processor or may share commom componets with each other. For example each of the phase/frequency recovery 205, the clock recovery 202 and the amplitude recovery 203 may receive signals from, and be considered to include, a decision slicer (not shown).

In operation, the tuner 216 selects an appropriate carrier frequency and receives the electronic signal from the propagation medium. The output of the tuner 216 may be converted to digital samples by an A/D converter (not shown) and demodulated by the demodulator 218 to the correct frequency range and the carrier frequency is removed from the modulated data signal.

Figure 3:
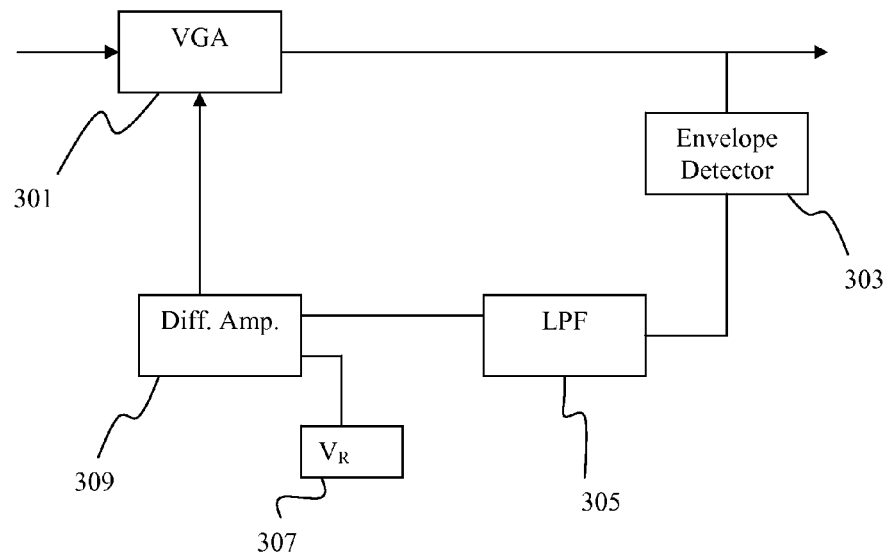
FIG. 3 illustrates an exemplary functional circuit arrangement for a voltage controlled amplifier according to the invention.

The amplitude recovery unit preferably includes an automatic gain control (AGC) feedback loop, which automatically adjusts the gain level of the amplitude recovery unit. FIG. 3 illustrates a functional arrangement of an AGC feedback loop. As illustrated in FIG. 3, the received data signal is provided to a variable gain amplifier 301 which amplifies the received data signal according to the gain settings. An envelope detector 303 receives the amplified data signal as a feedback and detects the data signal. A low pass filter 305 filters the data signal to remove signal components greater than a predetermined threshold. The data signal is provided to a differential amplifier 309 where it is compared to a reference source 307, which may be a reference voltage VR of a reference signal. The output of the differential amplifier is provided to the variable gain amplifier 301 to adjust the gain to reduce an offset detected between the detected signal and the reference signal by differential amplifier 309. The detected offset may be distortions in the amplitude of the data signal. The reference voltage may be provided from a look up table or may be provided from creating a digital image of the received data signal.

In the preferred implementation, the variable gain amplifier 301 can maintain a sufficient phase margin to prevent circuit oscillation, e.g. to prevent a positive feedback, and provided sufficient gain to remove the detected offset for all frequencies within data signal bandwidth, e.g. 10 Hz-20 KHz. Those of skill in the art will appreciate that the phase margin is generally the difference in phase of feedback signal and the output signal of a feedback loop, and that a phase margin of 0 degrees often causes circuit oscillation as the feedback loop is no longer negative. In the preferred implementation a phase margin of at least 15 degrees of separation is used. Those of skill in the art will also appreciate that an amplifier has a gain bandwidth product which indicates the ability of an amplifier to amplify at a certain gain and certain bandwidth without distorting (e.g. clipping) the output signal, e.g. $A=GB_wP$, where A=amplification, G=gain, P=the gain bandwidth product, and $B_w$=amplification bandwidth. As the gain of the amplifier increases, the capable bandwidth of amplification often decreases and the phase margin in the feedback loop also often decreases.

Figure 4:
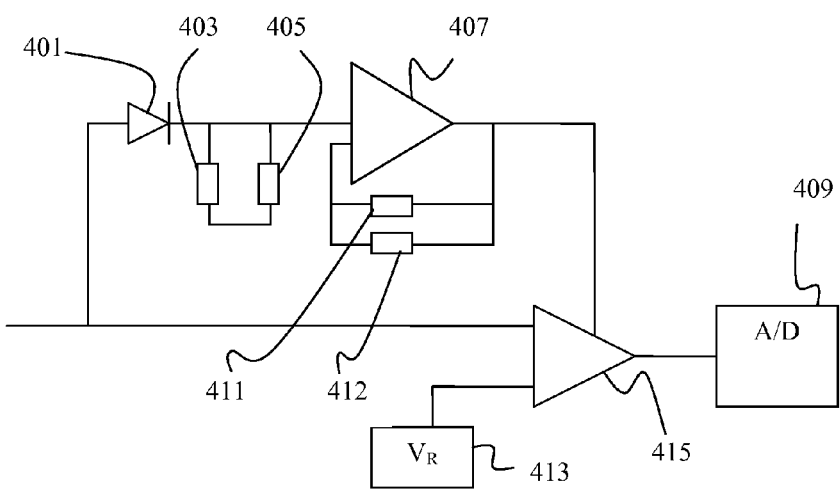
FIG. 4 illustrates an exemplary functional circuit arrangement for removing AM hum according to the invention.

FIG. 4 illustrates another exemplary functional arrangement of an approach for removing distortions in the amplitude modulation signal component. As illustrated in FIG. 4, a data signal is provided to diode 401 and to resistor 403 and capacitor 405, which together operate as a rectifier circuit, e.g. a ½ wave rectifier circuit which detects either the positive or negative portion of the amplitude distortion on the amplitude modulated signal component. The detected amplitude distortion is provided to a differential amplifier 407 which has a resistor 411 and capacitor 412 in a negative feedback arrangement. Those of skill in the art will appreciate that resistor 411 and capacitor 412 operate as a low pass filter, serve to adjust the gain of differential amplifier 407 and invert the phase of the measured amplitude distortion signal. Resistor 411 and capacitor 412 may be fixed values to provide predetermined filtering and gain levels. Differential amplifier 407 compares the phase inverted amplitude distortion with the measured amplitude distortion in a negative feedback to cause the signals to destructively interfere with each other and smooth out the distortion, e.g. to virtually provide a dc signal. Differential amplifier 415 receives the data signal and a reference signal from reference source $V_R$ 413. The reference source is preferably a generated version of the data signal without distortions, such as from a digitized copy of the data signal. The data signal is compared to the reference signal by differential amplifier 415, which is gain controlled by the output of differential amplifier 407, to remove the offset between the data signal and the reference signal. The cleaned data signal is provided to analog to digital converter 409 and recombined with signals from the frequency recovery unit 205 and the clock recovery unit 202.

Figure 5:
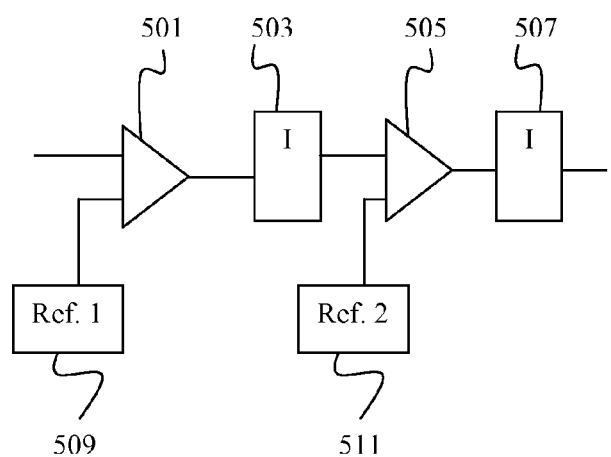
FIG. 5 illustrates another exemplary functional circuit arrangement for removing AM hum according to the invention.

FIG. 5 illustrates a functional arrangement to increase the bandwidth of an AGC unit with adequate gain and maintaining the phase margin in a stable range, such as at least 15 degrees. As illustrated in FIG. 5, several amplification stages may be used as indicated by amplifier stage 501 and 505, which are compared against reference signals 509 and 511. Isolation circuits 505 and 507 may be provided to isolate the gain stages from each other. By using several gain stages, the gain of each amplifier 501 and 505 may be kept low, providing a wide bandwidth which extends over the signal bandwidth (e.g. 10 Hz to 20 KHz), and provide an adequate phase margin to prevent oscillation.

While FIGS. 3-5 have been illustrated as functional circuits, the operations may be performed in a digital signal processor or ASIC. For example the DSP may be programmed to use a look up table to adjust the amplification level by adjusting the reference voltage. Also, the bandwidth of equalizer taps may be digitally increased so that the equalization operates on a bandwidth of the data signal.

As described above, the process of transmitting a signal over the propagation medium introduces impairments into the transmitted signal. Therefore, the adaptive equalizer 204 may also include a combination of hardware, software, and/or firmware for resolving these impairments. For example, the adaptive equalizer 204 may include finite impulse response (FIR) filters and infinite impulse response (IIR) filters. The adaptive equalizer 204 may also include software and/or firmware operable to be executed to carry out functions of the adaptive equalizer 204 to resolve specific impairments in the received signal. Although, not illustrated, the adaptive equalizer 204 may include processors, mixers (multipliers) for translating processed I and Q signal components to baseband frequency (DC), slicers, phase detectors, loop filters, sine/cosine generators, feedback equalizers, digital signal processors (DSP), attenuators, gain generators, etc. Moreover, although the adaptive equalizer 204 is illustrated in FIG. 2 as a single component, a person having ordinary skill in the art will appreciate that the adaptive equalizer 204 may include any reasonably suitable combination of different components.

The adaptive equalizer 204 may be tuned to correct a particular amount of AM hum. Tuning the adaptive equalizer refers to configuring the adaptive equalizer 204 to perform specific operations. For instance, the adaptive equalizer 204 may include firmware executed by the adaptive equalizer 204 to instruct the adaptive equalizer 204 to correct specific impairments, such as AM hum. For example, the firmware may instruct the equalizer to correct AM hum above 3%, for instance, at 4%, 5%, 6%, 7%, 8%, etc. In particular, correcting AM hum at 6% may provide a substantial reduction of error rates in the receiver.

Tuning the adaptive equalizer 204 to correct AM hum may also include increasing the intermediate frequency (IF) and Fine AGC bandwidth and enabling a second-stage digital AGC. For example, enabling a second-stage AGC may include activating an amplitude gain control block (AGCB) located downstream of a Nyquist filter. Tuning may also include increasing feed forward equalization (FFE) main tap bandwidth or adaptation speed, moving the FFE main tap from one tap to another, and increasing the FFE post-cursor tap leakage to improve stability.

The receiver 204 further includes a carrier recovery module 224, an error correction decoding module 226, and a D/A converter 228. The output of the adaptive equalizer 204 is coupled to the carrier recovery module 224, which pulls the local crystal oscillator into precise carrier frequency and phase lock, and provides data bit estimates to the error correction decoding module 226. After error correction decoding, the digital data is recovered, and reproductions of the original data supplied by the information source 208 is output from the receiver 14.

One or more of the processes and functions described herein are operable to be implemented as software or firmware stored on a computer readable medium. The steps are operable to be embodied by a computer program, which can exist in a variety of forms both active and inactive. For example, they exist as software and/or firmware program(s) comprised of program instructions in source code, object code, executable code or other formats for performing some of the steps. The codes described above may be embodied on a computer readable medium, which include storage devices and signals, in compressed or uncompressed form. Examples of suitable computer readable storage devices include conventional computer system RAM (random access memory), ROM (read only memory), EPROM (erasable, programmable ROM), EEPROM (electrically erasable, programmable ROM), and magnetic or optical disks or tapes. Examples of computer readable signals, whether modulated using a carrier or not, are signals that a computer system running the computer program may be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

Thus, the systems and methods described herein greatly improve the ability of a receiver to process a received signal. For example, a modem in the HFC network 100 may resolve impairments in downstream signals transmitted from the head-end 102 with increased proficiency and success. In this manner, receivers are provided with substantially greater reliability, because they are less prone to failure and loss of data. Moreover, the receivers described herein have the ability to produce a signal more accurately resembling the pure signal initially sent from a transmitter.

While the embodiments have been described with reference to examples, those skilled in the art will be able to make various modifications to the described embodiments without departing from the true spirit and scope. The terms and descriptions used herein are set forth by way of illustration only and are not meant as limitations. In particular, although the methods have been described by examples, steps of the methods may be performed in different orders than illustrated or simultaneously. Those skilled in the art will recognize that these and other variations are possible within the spirit and scope as defined in the following claims and their equivalents.

What is claimed is:

1. A method for receiving a signal in a communications system comprising:
   receiving a modulated electronic signal having AM hum impairment at a receiver;
   tuning an adaptive equalizer such that the adaptive equalizer is configured to remove the AM hum impairment in the electronic signal above 3% while not correcting AM hum impairment under 3%; and
   outputting the electronic signal having the AM hum impairment removed above 3%.

2. The method of claim 1, wherein tuning the adaptive equalizer comprises:
   executing firmware to instruct the adaptive equalizer to remove the AM hum above 3%.

3. The method of claim 1, wherein the receiver includes a modem and receiving the electronic signal comprises:
   receiving the electronic signal downstream in an HFC network and removing a carrier signal from the electronic signal.

4. The method of claim 1, wherein removing the AM hum impairment comprises:
   correcting the AM hum impairment at up to 6% or more with AM disturbances ranging from 10 Hz to 20 KHz.

5. The method of claim 1, further comprising:
   variably attenuating and adding gain to the electronic signal.

6. The method of claim 1, wherein receiving an electronic signal includes receiving a digitally modulated electronic signal and the method further comprises:
   demodulating the digitally modulated electronic signal.

7. The method of claim 1, wherein removing the AM hum impairment comprises:
   performing adaptive equalization with at least one filter to correct the AM hum impairment.

8. A receiver for receiving an electronic signal having impairments, the receiver comprising:
   an adaptive equalizer configured to:
   receive a modulated electronic signal having AM hum impairment;
   be tuned to correct an AM hum impairment above 3% while not correcting AM hum impairment under 3%; and
   output the electronic signal having the AM hum impairment corrected above 3%.

9. The receiver of claim 8, wherein the adaptive equalizer is operable to execute firmware, which instructs the adaptive equalizer to correct the AM hum impairment above 3%.

10. The receiver of claim 8, wherein the adaptive equalizer is tuned to correct the AM hum impairment at 6%.

11. The receiver of claim 8, wherein the receiver comprises a tuner and demodulator, which receives and demodulates the electronic signal downstream from an HFC network.

12. The receiver of claim 8, wherein the adaptive equalizer comprises at least one filter.

13. The receiver of claim 8, wherein the receiver further comprises:
   an attenuator; and
   a gain generator, wherein the attenuator and the gain generator are operable to variably attenuate and add gain to the electronic signal.

14. The receiver of claim 8, wherein the receiver is operable to receive a digitally modulated electronic signal and the receiver further comprises:
   a demodulator operable to demodulate the digitally modulated electronic signal.

15. A non-transitory computer readable medium on which is encoded program code for resolving impairments, the program code comprising:
   program code for receiving a modulated electronic signal having AM hum impairment at a modem;
   program code for tuning an adaptive equalizer such that the adaptive equalizer is configured for correcting an AM hum impairment in the electronic signal received at the modem above 3% while not correcting AM hum impairment under 3%; and
   program code for outputting the electronic signal having the AM hum impairment corrected above 3%.

16. The non-transitory computer readable medium of claim 15, wherein the program code for tuning the adaptive equalizer such that the adaptive equalizer is configured for correcting the AM hum impairment in the electronic signal includes program code for tuning the adaptive equalizer such that the adaptive equalizer is configured for correcting the AM hum at 6% or more.

* * * * *